(12) United States Patent
Azuma

(10) Patent No.: US 6,425,785 B1
(45) Date of Patent: Jul. 30, 2002

(54) ELECTRIC CONNECTOR

(75) Inventor: Eddie A. Azuma, Yokohama (JP)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/561,021

(22) Filed: Apr. 28, 2000

(30) Foreign Application Priority Data

Apr. 28, 1999 (JP) .......................................... 11-121583

(51) Int. Cl.$^7$ ................................................ H01R 13/40
(52) U.S. Cl. .................................... 439/733.1; 439/660
(58) Field of Search .......................... 439/75, 660, 678, 439/733.1, 83, 74, 857

(56) References Cited

U.S. PATENT DOCUMENTS

| | | | |
|---|---|---|---|
| 3,868,162 A | 2/1975 | Ammon | 339/17 M |
| 3,923,365 A | 12/1975 | Lynch | 339/221 |
| 5,131,871 A | 7/1992 | Banakis et al. | 439/751 |
| 5,190,483 A | 3/1993 | Viselli | 439/751 |
| 5,419,710 A | 5/1995 | Pfaff | 439/266 |
| 5,692,928 A | * 12/1997 | Nelson | 439/733.1 |

FOREIGN PATENT DOCUMENTS

| | | |
|---|---|---|
| EP | 0740374 A2 | 10/1996 |
| EP | 0836243 A2 | 4/1998 |
| WO | WO98/15990 | 4/1998 |

* cited by examiner

*Primary Examiner*—P. Austin Bradley
*Assistant Examiner*—Briggitte R. Hammond
(74) *Attorney, Agent, or Firm*—Perman & Green, LLP

(57) ABSTRACT

An electric connector of the present invention is directed to alleviating a stress in housings of an electric connector. In the housings 16 of the electric connector, slots 44, 46 are formed to receive associated terminals. Projections 48a, 48b are formed in a staggered fashion on the oppose wall portions of the slot. The terminal 24 has a retaining section 28 against which the projections 48a, 48b abut and a projection 29 abutting against one wall surface. By the projection 29 and projection 48a on the wall surface against which the projection 29 abuts, a projection 48b on the other wall surf ace supports a force urging the terminal 24, so that the terminal 24 is retained in place in the slot 44.

12 Claims, 5 Drawing Sheets

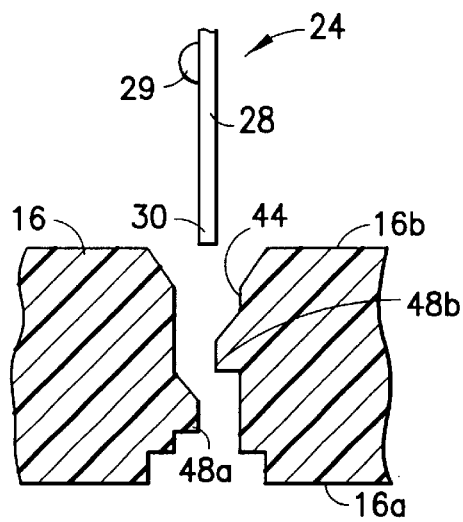
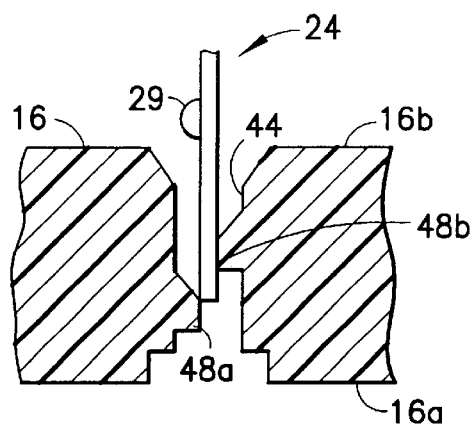
FIG.5A  FIG.5B
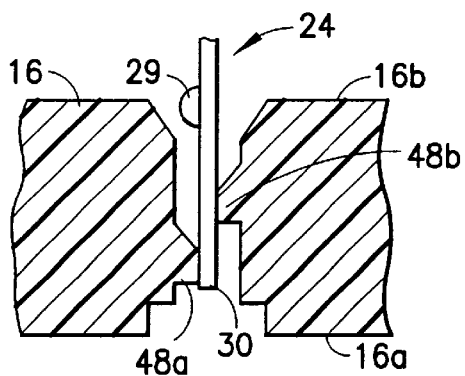
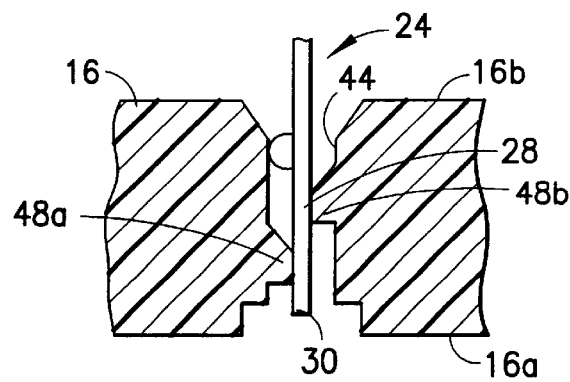
FIG.5C  FIG.5D
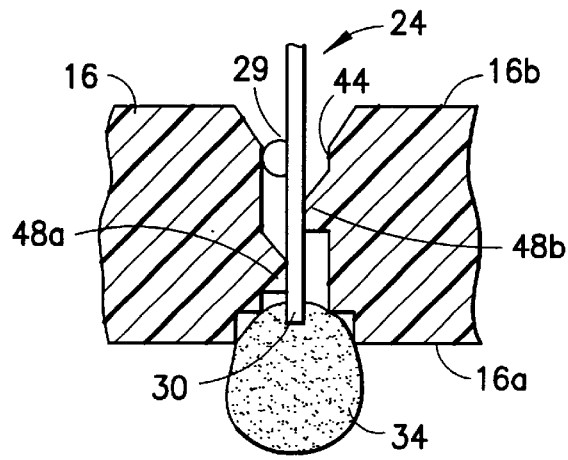
FIG.5E

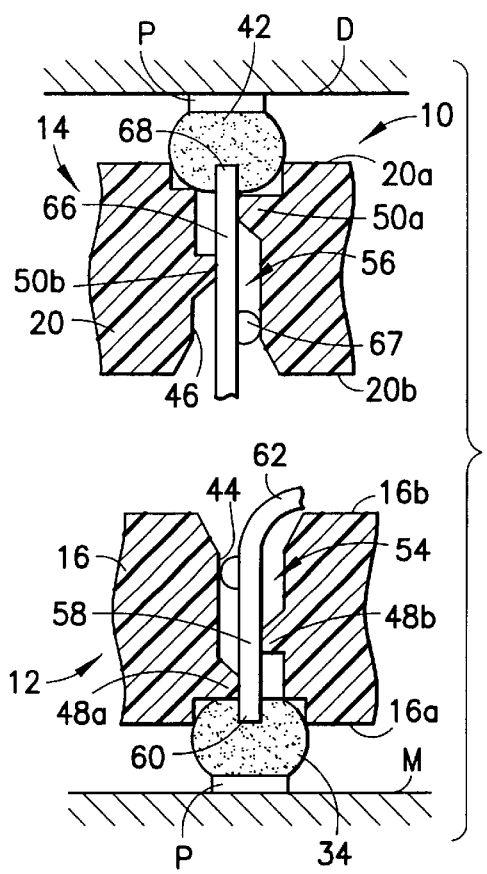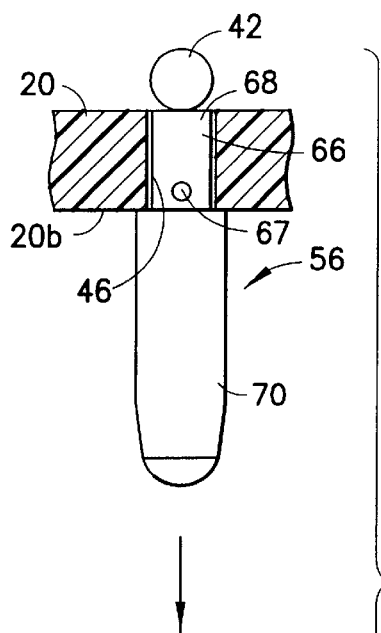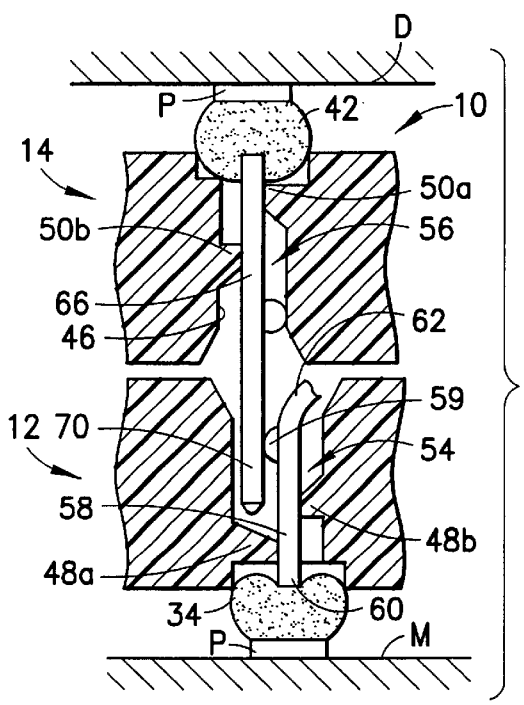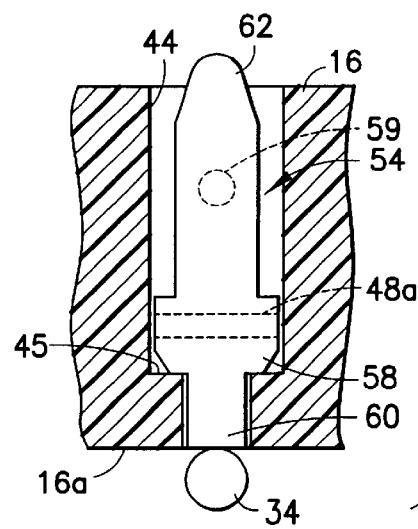
FIG. 6A
FIG. 6B
FIG. 6C

ELECTRIC CONNECTOR

BACKGROUND OF THE INVENTION

The present invention relates to a high-density electric connector called as a BGA connector to be connected to a board through solder balls arranged in a grid-like array.

With a recent advance of an electronic apparatus, such as a computer, toward a high-density and miniaturization unit, a surface-mounting high-density connector called a BGA connector ha been developed in which solder balls are arranged at the connection sections of respective terminals to be connected to a board and such solder balls are a ranged as a grid-like array on the connector housing. The BGA connector is placed on contact pads arranged on a board surface and each solder ball is partially melted by heating and bonded to the corresponding contact pad on the board. The distance between th mutually adjacent solder balls is very narrow and a larger number of solder balls can be provided on the board in a limited range.

In the BGA connector, a large number of slots extend through the bottom wall of an insulating housing and a terminal is received in each lot. Normally, respective projections are provided in a coaxially opposed state, on an opposite wall of each slot. The respective terminal has its retaining section forced into the slot at an area between the opposite projections and is held in the slot, while the retaining section is pushed by the opposed projections from both sides. A contact section contacting with the terminal of the associated connector is projected from a mating surface mated to the associated connector and a connection section is placed in the corresponding opening on an attaching surface side attached to a printed circuit board and a solder ball is attached to the connection section. By simply pressing the respective terminal into the slot at an area between the opposite projections, the terminal can be readily attached to the housing.

In the case where a compact and high-density connector is formed for use in an IC package, such as a CPU, the dimensions of the housing, such as the wall thickness and height, are restricted to very small values and a force by which such a terminal is retained in the housing produces a greater stress in the housing. Such a greater stress acting upon the housing provides a cause for a crack. In particular where the connector is soldered to a printed circuit board, etc., by a reflow soldering, there is produced a cause for thermal deformation.

BRIEF DESCRIPTION OF THE INVENTION

It is accordingly the object of the present invention is to provide a very simple and inexpensive electric connector which can positively retain respective terminals in associated slots in the housing and prevent any deformation of the housing.

In order to achieve the above-mentioned object of the present invention, there is provided an electric connector having an insulating housing and a plurality of terminals in the insulating housing, the housing receiving respective terminals and having a plurality of slots with a plurality of projections formed in a staggered fashion on mutually opposed surfaces, the terminal having a retaining section against which these projections abut and a projection abutting against one of the opposed wall surfaces, in which the projection on the other surface supports a terminal urging force to retain the terminal in place in the slot.

According to the electric connector, projections are projected in an offset fashion from the opposed surfaces in the slot and, when being abutted against the retaining section of the terminal, these projections impart no greater stress to the housing and, further, a projection on the terminal together with the above-mentioned projections in the slot, positively supports the terminal relative to the housing.

The housing has a mating surface mated to an associated connector and housing a terminal insertion inlet opened at the respective slot, the projection on the terminal is formed on the retaining section and a distance from a forward end of the retaining section to the projection of the terminal is preferably so formed as to be made longer than a distance between the mating plane and the projection on a side spaced apart from the mating plane. When, in this case, the forward end of the terminal engages the projection on a side spaced apart from the mating surface, since the projection is arranged outside the slot, the projection on the terminal is smoothly inserted without any intervention when the retaining section of the terminal is inserted between the opposed projections in the slot. Further the terminal preferably has a connection section externally exposed from the slot and on which the solder ball is mounted.

The projection can provide a contact making contact with the plate-like terminal when it is inserted in the slot. In this case, it is possible to provide a terminal of a simple structure which positively engages the plate-like terminal of a mating connector through the rotation moment of the two projection.

BRIEF DESCRIPTION OF THE SEVERAL VIEWS OF THE DRAWING

FIGS. 5(A) to (E) explanatory views showing sequential steps of inserting the terminal into the slot; and FIGS. 6(A) to (C) are explanatory views showing male and female terminals in another embodiment, FIG. 6(A) being cross-sectional views showing the male and female terminals before they are mated to each other; FIG. 6(B) cross-sectional views showing the male and female terminals mated to each other; and FIG. 6(C) explanatory views showing the side surface shapes of the terminals.

DETAILED DESCRIPTION OF THE INVENTION

FIGS. 1 to 4 show an electric connector according to a preferred embodiment of the present embodiment. The embodiment is formed as a board-to-board electric connector for connecting a daughter board D to a mother board M.

Figure 1:
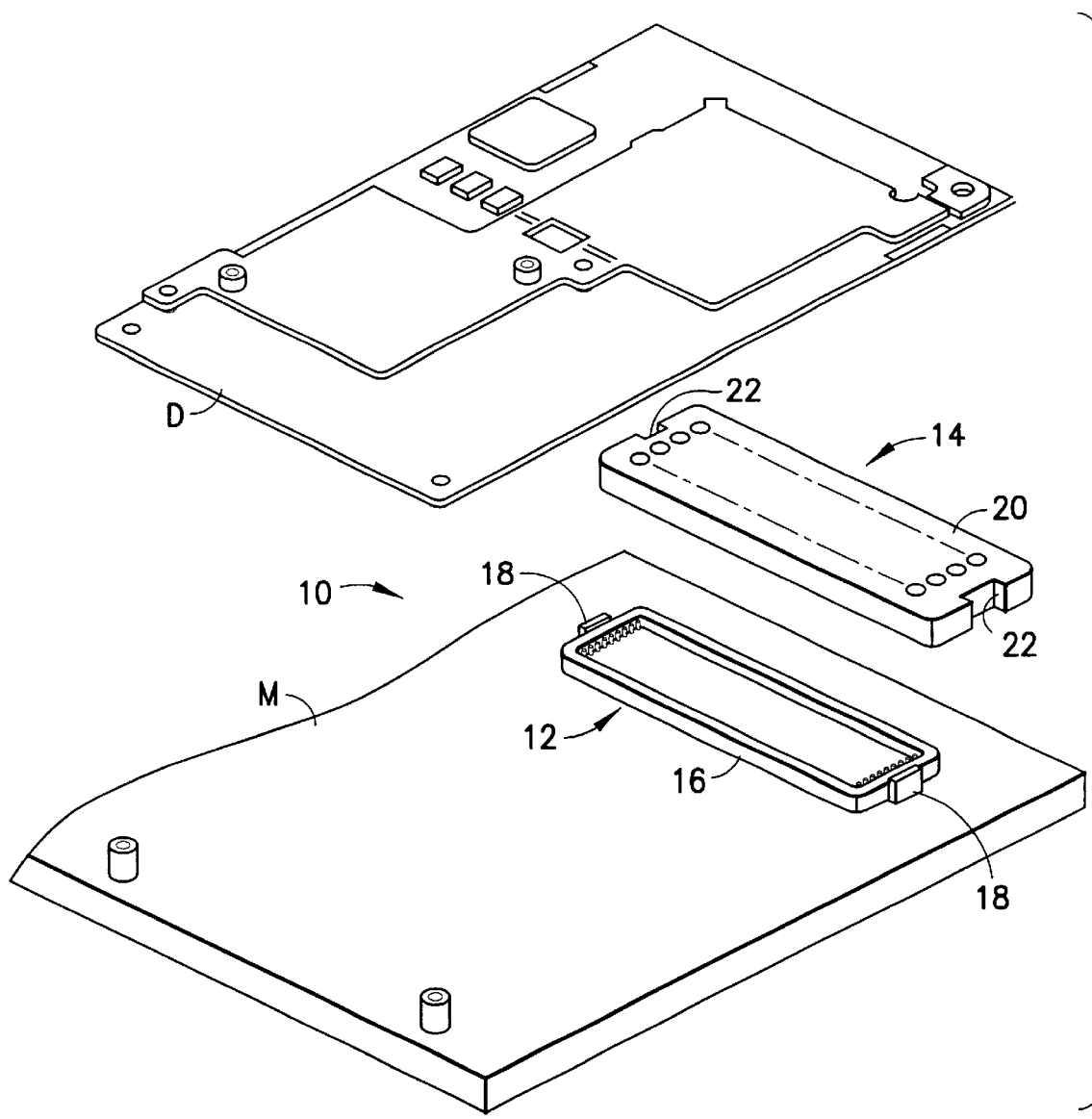
FIG. 1 is a perspective view diagrammatically showing an electric connector according to a preferred embodiment of the present invention.

The electric connector 10 of the present embodiment has a receptacle connector 12 attached to the mother board M and a plug connector 14 attached to the daughter board D. The receptacle connector 12 and plug connector 14 have solder balls arranged in a grid array on their attaching surfaces attached to the mother board M and daughter board D, respectively. In FIG. 1, in order to reveal the solder ball array, the plug connector 14 are illustrated as being detached from the daughter board D.

In the electric connector 10 of the present embodiment, a pair of polarity tabs 18 of different size are formed on a receptacle housing 16 and a pair of cutouts 22 are formed in a plug housing 20 in those places corresponding to the polarity tabs 18. The receptacle connector 12 and plug connector 14 can be prevented from being wrongly inserted into each other by arranging their mating surfaces in an opposed relation and aligning/mating the polarity tabs of different size with/to the corresponding cutouts 22. These housings 16, 20 are formed of a proper insulating material such as a liquid crystal polymer.

Figure 2:
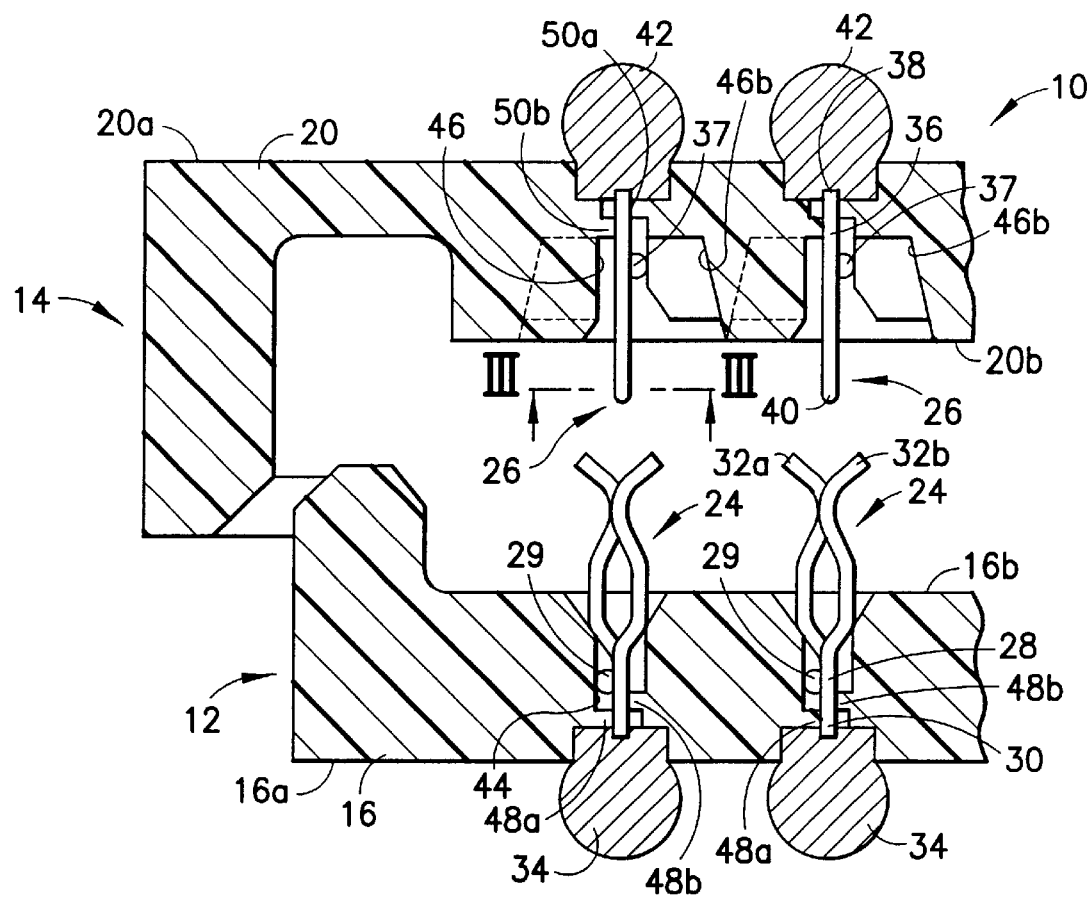
FIG. 2 is a cross-sectional view showing the internal structures of a receptacle housing and plug housing in an electric connector in FIG. 1.
Figure 3:
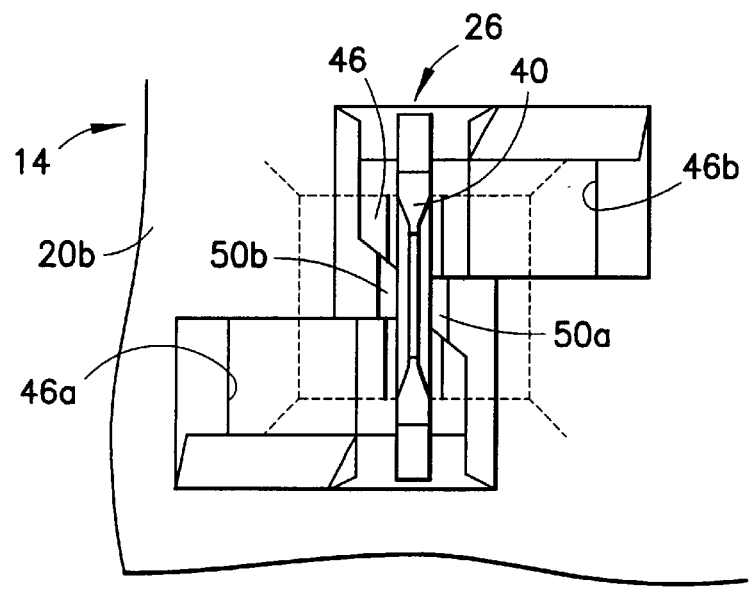
FIG. 3 is an explanatory view showing a slot as seen along line III—III in FIG. 2.
Figure 4:
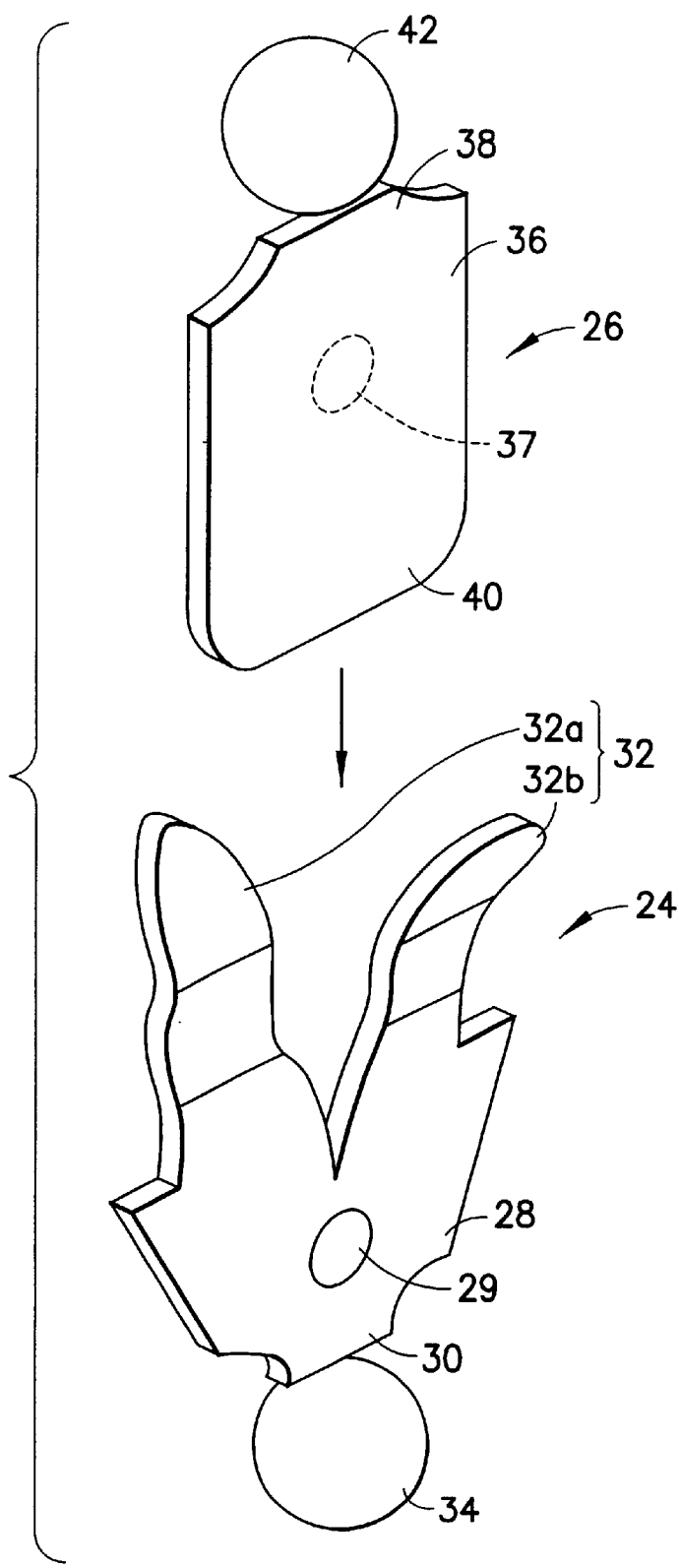
FIG. 4 is a perspective view showing a male terminal and female terminal in FIG. 2.

As shown in FIGS. 2 to 4, female terminals 24 are attached to the receptacle connector 12 and male terminals 26 are attached to the plug connector 14.

The female terminals 24 has their retaining section 28 retained by the receptacle housing 16 and solder balls 34 are attached to connection sections 30 of the female terminals which are situated near the attaching surface 16a of the receptacle housing 16. A contact section 32 of the female terminal 24 has a pair of contact arms 32a, 32b and is projected from the mating surface 16b. Similarly, the male terminals 26 have their retaining sections 36 retained by the plug housing 20. Solder balls 42 are attached to connection sections 38 of the male terminals which are situated near the attaching surface 20a. A sheet-like contact section 40 is projected from the mating surface 20b. When the plug connector 14 is mated to the receptacle connector 12, the contact section 40 of the male terminal 26 is held between the contact arms 32a, 32b of the contact section 32 of the female terminal and these terminals 24 and 26 can be electrically connected to each other. The female terminal 24 and male terminal 26 are made of a proper material, such as phosphor bronze or beryllium copper and their portions contacting the contact sections 32, 40 are preferably gold-plated.

In order to retain such female terminals 24 and male terminals 26, a large number of slots 44 and 46 are provided at a required interval in the receptacle housing 16 and plug housing 20. These slots 44 and 46 are opened at the mating surfaces 16b and 20b and attaching surfaces 16a and 20a, respectively, in the housings 16 and housing 20, that is, opened at both surfaces of the housing 16 and housing 20. In order for the solder balls 34 and 42 to be mounted in the openings of the attaching surfaces 16a and 20a, these openings allow the connection sections 30 and 38 of the female terminal 24 and male terminal 26 to be externally exposed. On the other hand, those openings of the mating surface (16b, 20b) sides are so formed as to be enlarged and to ensure the easiness with which the mating terminals are inserted. In order to prevent the terminals 24 and 26 from being slipped out of the attaching surface (16a, 20a) sides, shoulder portions, not shown, are provided at these slots 44 and 46 to latch the retaining sections 28 and 36.

A pair of projections 48a, 48b are provided in the slots 44 in the receptacle housing 16 and extend from the opposite wall surface portions in the slot. These projections 48a, 48b are arranged in an alternately staggered array in an axial direction of the slot 44, that is, along a direction perpendicular to the attaching surface 16a and mating surface 16b of the receptacle housing 16. On the other hand, a projection 29 extends from the retaining section 28 of the female terminal 24 and, together with the projection 48a, supports a force with which the projection 48b compresses the female terminal 24. As a result, the projection 29 retains the retaining section 28 in the slot 44 substantially along the axial direction. Although, in the present embodiment, the projection 29 is formed on the side opposite to the projection 48a, the present embodiment-is not restricted thereto. Such a projection may be of any type so long as it can support a rotation moment (moment acting in a counterclockwise direction in FIG. 2) acting upon the female terminal 24 by the projections 48a, 48b arranged in the alternately staggered array. Contrary to the case of FIG. 2, the projection 29 is formed on a side opposite to the projection 48b in the case where the projection 48b is arranged nearer the attaching surface 16a than the projection 48a. In either case it is preferred that a distance from the forward end of the retaining section 28 to the projection 29 be so formed as to be set longer than a distance between the mating surface 16b and the projection 48b on a side apart from the mating surface 16b.

FIG. 5 shows the order with which the female terminal 24 is sequentially mounted in the receptacle housing 16. Although an explanation will be given below about the receptacle connector 12 in FIG. 5, the something can also be said about the case of the plug connector 14 with any further explanation omitted.

As shown in FIG. 5(A), female terminals 24 are arranged in the insertion inlets of the slots 44 in an aligned relation. And as shown in FIGS. 5B to 5D the female terminal is inserted into the slot 44 from the connection section 30 on the forward end side and sequentially brought into engagement with the projections 48b, 48a. After engaging the connection section 30 with the projection 48a which is situated near the attaching surface 16a, the projection 29 extending from the retaining section 28 engages the wall surface of the slot. The retaining section 28 of the female terminal is moved in slide motion between the projections 48a and 48b, while slidably moving the projection 29 along the wall surface of the slot 44, and the connection section 30 is externally exposed from the opening on the attaching surface 16a side of the slot 44. Finally, as shown in FIG. 5(E), the solder ball 34 is attached to the connection section 30 on the attaching surface 16a side of the receptacle housing 16 and, by doing so, the mounting of the female terminal 24 is completed. The solder ball 34, together with the shoulder, not shown, in the slot 44, is retained in place in the slot 44 and is prevented from dropping from the slot 44.

In the receptacle housing 16, the projections 48a, 48b are arranged in a staggered fashion along the axial direction of the slot 44. After the forward end of the female terminal 24 has engaged the projection 48a near the attaching surface 16a, the projection 29 engages the wall surface of the slot 44 and, when the female terminal 24 is inserted into the slot 44, the projection 29 from the retaining section 30 provides no bar and the female terminal is smoothly inserted into the slot without any undue force to the projections 48a, 48b. Further, the projection 20 together with the projection 48a provided on the same side of the projection 48a supports a force by which the projection 48b pushes the female terminal 24. Therefore, the female terminal 24 is positively supported in the slot 44 and the receptacle housing 16 receives almost no stress from the female terminals 24 in the slots 44. Even if high temperature acts upon the receptacle housing 16 in a reflow soldering process, there is no thermal deformation and the solder balls 34 on the connection sections 30 of the respective female terminals 24 can be maintained in a common plane.

FIGS. 6(A) to (C) show an embodiment in which both male and female terminals are formed as plate-like ones with the same reference numerals employed in this embodiment to designate parts or elements corresponding to those shown in the previous embodiment and any further explanation omitted.

In this embodiment, a female terminal 54 has its retaining section 58 retained between projections 48a, 48b of a receptacle housing 16 and a solder ball 34 is mounted on a connection section 60 near an attaching surface 16a and a plate-like contact section 62 with a projection 59 therefrom is arranged in an insertion inlet of a slot 44. The projection 59 together with a projection 48a supports a force by which a projection 48b pushes the female terminal. In the same way as in the above-mentioned embodiment, the female terminal 54 is supported in the slot 44 at three points. A shoulder 45 formed in the slot 44 latches a step formed between the retaining section 58 and the connection section 60.

On the other hand, a male terminal 56 has its retaining section 66, that is, a retaining section with a projection 67, retained between projections 50a and 50b and is supported at three points, that is, at projections 67, 50a, 50b. A blade-like or flat plate-like contact section 70 is outwardly projected from a mating surface 20b. A step is formed between the contact section 70 and the retaining section 66 and is latched at the mating surface 20b of a plug housing 20.

In an electric connector 10 of this embodiment, the female terminal 54 has its projection 59 on the contact section 62 abutted against the wall surface of the slot 44 in a state in which the receptacle connector 12 and plug connector 14 are separated from each other. When the plug connector 14 is mated to the receptacle connector 12, the contact section 70 of the male terminal 56 is inserted into the slot 44 in the receptacle housing 16 and engages the projection 59 on the contact section 62 of the female terminal 54. By doing so, the male terminal 56 can receive a greater urging force from the female terminal 54. In order to facilitate the easiness with which the contact section 70 of the male terminal 56 is inserted, the contact section 62 of the female terminal 54 is preferably bent, as shown in FIGS. 6(A) and 6(B), toward a side opposite to a side on which the projection 59 is provided.

In the electric connector 10 of this embodiment, the female terminal 54 is supported in the slot 44 of the receptacle housing 16 at three points, that is, at the projection 59 and projections 48a, 48b arranged in a staggered fashion and the male terminal 56 is supported in the slot 46 of the plug housing 20 at three points, that is, at the projection 67 and projections 50a, 50b arranged in a staggered fashion, so that no greater stress is produced in the housings 16 and 20. Further, when these housings are mated together, the projection 59 on the female terminal 54 is contacted with the contact section 70 of the male terminal 56 and a rotation moment resulting from the two projections 48a, 48b arranged in the staggered fashion acts upon the contact section 70 of the male terminal 56 through the projection 59 of the female terminal, so that the female terminal 54 and male terminal 56 can be positively electrically connected to each other.

In FIG. 6, P shows a semiconductor pad formed on a mother board M and daughter board D. Solder balls 34 and 42 mounted on the female and male terminals are soldered to solder pad P by a reflow soldering method. It is preferred that, as in the aforementioned embodiment, the female terminal 54 and male terminal 56 be formed of a proper material, such as phosphor bronze or beryllium bronze, and their contacting portions be gold-plated.

As evident from the above, according to the present invention, the respective terminal is retained in the slot at three points, that is, at the projections formed in the staggered fashion on the opposed wall surface portions of the slot and at the projection from the terminal. This very simple structure can positively retain the terminals in place without producing any greater stress in the housing.

The projection of the terminal is so formed as to be projected from the retaining section. And, if the distance from the forward end portion of the retaining section to the projection is made longer than a distance between the mating surface and the projection spaced apart from the mating surface, the terminal can be smoothly inserted into the slot without the projection being damaged by the forward end portion of the retaining section.

Further, in the case where the projection of the terminal constitutes a contact against the plate-like terminal of a mating connector, the female terminal, being simpler in structure, can be positively set in engagement with the male terminal.

What is claimed is:

1. An electrical connector comprising an insulating housing having at least one terminal holding slot, and at least one terminal positioned in the at least one slot, the at least one slot having first and second projections extending from opposite sides of the at least one slot, the first and second projections being staggered relative to each other, and the at least one terminal having a retaining section with a third projection extending from the retaining section, wherein the retaining section is located between the first and second projections which apply a moment couple to the retaining section, and the third projection extending from the retaining section contacts a side of the at least one slot and urges the retaining section against the moment couple applied by the first and second projections to the retaining section for holding the at least one terminal in the at least one slot.

2. The electrical connector according to claim 1, wherein the at least one slot comprises a plurality of slots, and the at least one terminal comprises a plurality of terminals, each terminal being positioned in a corresponding one of the plurality of slots.

3. The electrical connector according to claim 1 wherein the at least one terminal is a male terminal.

4. The electrical connector according to claim 1 wherein the at least one terminal is a male terminal.

5. The electrical connector according to claim 1 wherein the at least one terminal has a connection section externally exposed from the at least one slot on which a solder ball is mounted.

6. The electrical connector according to claim 1 wherein the third projection extends from a side of the retaining section facing the first projection in the at least one slot.

7. The electrical connector according to claim 6 wherein the second projection contacts another side of the retaining section opposite to the side from which the third projection extends.

8. An electrical connector assembly comprising:
the electrical connector according to claim 5; and
a mating connector adapted to be mated to the electrical connector, the mating connector comprising a second insulating housing and at least one mating terminal adapted to be mated to the at least one terminal in the electrical connector, the at least one mating terminal being positioned in a slot in the second insulating housing, the slot in the second insulating housing having corresponding first and second projections which extend from opposing surfaces of the slot in the second housing and are offset relative to each other, the corresponding first and second projections of the slot in the second housing holding a retaining section of the at least one mating terminal inbetween, wherein the retaining section of the at least one mating terminal has a corresponding third projection extending therefrom and contacting a side of the slot in the second insulating housing to urge the retaining section against the corresponding first and second projections of the slot in the second housing.

9. The electrical connector assembly according to claim 8 wherein the at least one terminal in the electrical connector is a male terminal, and the at least one mating terminal in the mating electrical connector is a female terminal.

10. The electrical connector according to claim 1 wherein the insulating housing includes a mating surface for mating with a housing of a mating connector, the first projection being located in the at least one slot closer to the mating surface than the second projection, and wherein the third projection extends from a side of the retaining section opposite to the first projection.

11. The electrical connector according to claim 10 wherein the third projection is located closer to the mating surface than the first and second projections.

12. The electrical connector according to claim 10 wherein the third projection is located on the retaining section so that a distance between a forward end of the retaining section and the third projection is greater than a second distance between the mating surface of the insulating housing and first projection, the forward end of the retaining section being disposed in the at least one slot further from the mating surface than the second projection.

* * * * *